(12) United States Patent
Kim et al.

(10) Patent No.: US 7,560,358 B1
(45) Date of Patent: Jul. 14, 2009

(54) METHOD OF PREPARING ACTIVE SILICON REGIONS FOR CMOS OR OTHER DEVICES

(75) Inventors: Seiyon Kim, Portland, OR (US); Peter L. D. Chang, Portland, OR (US); Ibrahim Ban, Beaverton, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 11/967,708

(22) Filed: Dec. 31, 2007

(51) Int. Cl.
*H01L 27/01* (2006.01)
(52) U.S. Cl. .............................. 438/424; 257/E21.085; 438/164; 438/157; 438/479; 438/149; 438/151
(58) Field of Classification Search ................ 438/149, 438/151, 283, 285, 164, 157, 479, 424; 257/353, 257/288, 347, 352, E21.04, E21.085, E21.127, 257/E27.111, E27.112, E27.009
See application file for complete search history.

(56) References Cited

U.S. PATENT DOCUMENTS

2005/0227435 A1* 10/2005 Oh et al. ..................... 438/257
2008/0150075 A1* 6/2008 Chang ......................... 257/506

\* cited by examiner

*Primary Examiner*—A. Sefer
*Assistant Examiner*—Ermias Woldegeorgis
(74) *Attorney, Agent, or Firm*—Kenneth A. Nelson

(57) ABSTRACT

A method of preparing active silicon regions for CMOS or other devices includes providing a structure including a silicon substrate (210, 410) having formed thereon first and second silicon diffusion lines (110, 420), both of which include first and second silicon layers (211, 213, 421, 423), a silicon germanium layer (212, 422), and a mask layer (214, 424). The method further includes forming an oxide layer (430) in first and second regions of the structure, forming a polysilicon layer (510) over the oxide layer, removing the polysilicon layer from the first region and depositing oxide (610) therein in order to form an oxide anchor, removing the polysilicon layer from the second region, removing the silicon germanium layer, filling the first and second gaps with an electrically insulating material (910), and depositing oxide in the second region.

15 Claims, 9 Drawing Sheets

US 7,560,358 B1

METHOD OF PREPARING ACTIVE SILICON REGIONS FOR CMOS OR OTHER DEVICES

FIELD OF THE INVENTION

The disclosed embodiments of the invention relate generally to silicon-on-insulator formation schemes, and relate more particularly to the formation of anchor structures supporting the silicon-on-insulator formation.

BACKGROUND OF THE INVENTION

The semiconductor manufacturing industry has long been focused on the miniaturization of microelectronic devices. One strategy that has been used to continue the miniaturization trend is known as silicon-on-insulator, or SOI. This technique uses a substrate having an electrically insulating layer in between layers of silicon as a means to improve performance due to, for example, the reduction of the short channel effect (SCE) and parasitic device capacitance. In addition, the floating body effect from the isolated channel enables us to use the device on SOI as a memory device. On the other hand, SOI technology does have certain limitations, such as those that arise as a result of the difficulty in controlling film thicknesses, resistances, and other parameters. As device scaling continues to advance these limitations will become increasingly problematic. SOI substrates also have higher manufacturing costs than bulk silicon substrates.

Silicon-on replacement insulator (SRI) technology (sometimes also called silicon-on-nothing, or SON) is in many respects a way of overcoming the limitations of SOI. In SRI technology, a silicon film is epitaxially grown on a sacrificial silicon germanium (SiGe) layer that when removed, leaves an air gap under the film that will later be replaced with an insulator. Yet the SRI process comes with its own set of issues, including silicon corrosion in the unprotected source/drain (S/D) regions and degradation in selectivity during SiGe removal etching. For example, it has been found that plasma damage on silicon exposed to an oxide dry etch process can cause top silicon loss during SiGe etching.

BRIEF DESCRIPTION OF THE DRAWINGS

The disclosed embodiments will be better understood from a reading of the following detailed description, taken in conjunction with the accompanying figures in the drawings in which.

Figure 1:
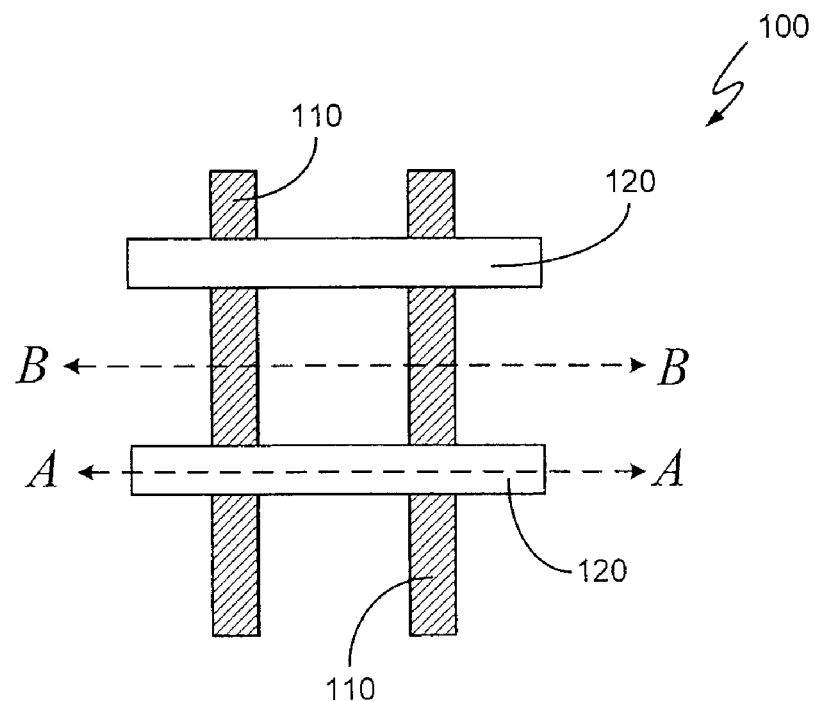
FIG. 1 is a plan view of a portion of a complementary metal-oxide semiconductor (CMOS) device according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a method of preparing active silicon regions for CMOS or other devices (such as other silicon electric devices, electro-mechanical devices including microelectromechanical systems (MEMS) devices, and the like) comprises providing a structure having a first region and a second region. The structure comprises a silicon substrate having formed thereon a first silicon diffusion line and a second silicon diffusion line, both of which comprise a first silicon layer, a silicon germanium layer over the first silicon layer, a second silicon layer over the silicon germanium layer, and a mask layer over the second silicon layer. The structure also comprises a trench between the first and second silicon diffusion lines.

The method further comprises forming an oxide layer in the first and second regions, forming a polysilicon layer over the oxide layer in the first and second regions, removing the polysilicon layer from the first region and depositing oxide therein in order to form an oxide anchor in the first region, removing the polysilicon layer from the second region, removing the silicon germanium layer from the first and second diffusion lines in order to create a first gap in the first diffusion line and a second gap in the second diffusion line, filling the first gap and the second gap with an electrically insulating material, and depositing oxide in the second region.

Embodiments of the invention help solve at least some of the issues that complicate SRI technology which, as mentioned above, include silicon corrosion in the S/D regions and degradation in selectivity during SiGe removal etching. As an example, loss of selectivity is minimized for embodiments of the invention because top silicon and sidewalls are not exposed to oxide dry etching. As another example, the SiGe removal etch is performed prior to formation of the gate in order to reduce interactions between plasma processes and SiGe etching, thus reducing or eliminating the problem of silicon corrosion.

The foregoing and other features of embodiments of the invention represent significant advances in CMOS manufacturing technology. For example, the absence of top silicon damage enables aggressive body thickness scaling. Furthermore, the selection of gate materials and structures becomes much more flexible when the gate is formed after SiGe etch so that there is no impact of SiGe etching on gate structures. (As one example, this allows the use of various high-k and metal gate materials.) Also, standard bulk transistor processes can be used with minimal changes because SOI formation is finished during trench processing.

Because the dry/wet etch selectivity of poly-silicon on oxide and nitride is very high, poly-silicon can be utilized to form an anchor structure without severe dry etch damage. Upfront formation of an SRI structure also can reduce the interaction between previous processes with SiGe etching. Advantageously, as has been mentioned, the methods of preparing active silicon regions for CMOS or other devices that are disclosed herein perform SiGe etching prior to gate formation, protect top silicon with a mask layer during the entire process, and form an anchor structure without ever exposing it to an oxide dry etch.

Figure 2:
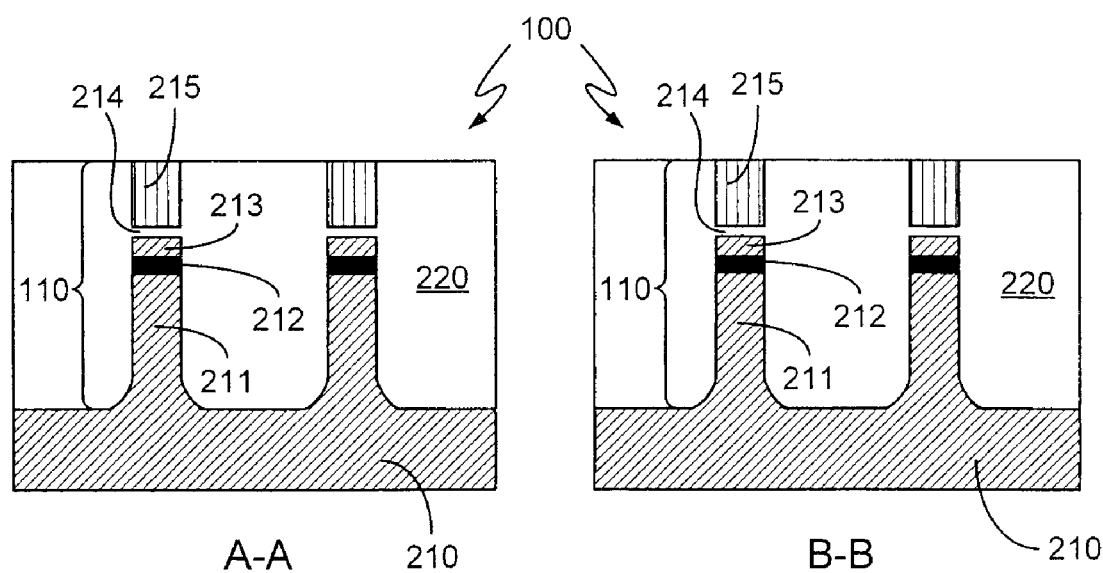
FIG. 2 is a cross-sectional view of a portion of a CMOS device according to an embodiment of the invention.

Referring now to the drawings, FIG. 1 is a plan view and FIG. 2 is a cross-sectional view of a portion of a complementary metal-oxide semiconductor (CMOS) device 100 according to an embodiment of the invention. As illustrated in FIG. 1, CMOS device 100 comprises diffusion lines 110 and anchors 120. The illustrated embodiment depicts anchors 120 lying at right angles to diffusion lines 110 but in non-illustrated embodiments anchors 120 may be arranged at any other angle with respect to diffusion lines 110. FIG. 1 also defines a cross section taken along a line A-A (referred to herein as region A-A) and a cross section taken along a line B-B (referred to herein as region B-B). Cross section A-A is a cross section of CMOS device 100 through one of anchors 120. These regions are defined by lithography using techniques known in the art. Cross section B-B is a cross section of CMOS device 100 through diffusion lines 110 in between anchors 120. Portions of subsequent drawings labeled A-A depict structure and processing activity that takes place within cross section A-A, while portions of those drawings labeled B-B depict structure and processing activity that takes place within cross section B-B.

As illustrated in FIG. 2, CMOS device 100 comprises a region A-A (the anchor region, depicted in the left-hand portion of FIG. 2) and a region B-B (the region away from the anchor(s), depicted in the right-hand portion of FIG. 2). This convention will be followed throughout all of the drawings, namely, region A-A and region B-B will be depicted in left and right portions, respectively, of a particular drawing figure. In certain figures, like FIG. 2, regions A-A and B-B will be identical. In other figures there will be differences between regions A-A and B-B, as will be described in the text accompanying such figures.

CMOS device 100 comprises a silicon substrate 210 on which is formed diffusion line 110. Diffusion line 110 comprises a silicon layer 211, an electrically insulating layer 212 (this is the replacement insulator) over silicon layer 211, a silicon layer 213 over electrically insulating layer 212, a mask layer 214 over silicon layer 213, and a mask layer 215 over mask layer 214. An oxide 220 fills the rest of the space in regions A-A and B-B. Diffusion line 110 passes through both regions A-A and B-B, as may be seen by its presence in both the left and the right portions of FIG. 2. FIG. 1 also shows that diffusion line 110 passes through both regions A-A and B-B.

As an example, electrically insulating layer 212 and mask layers 214 and 215 can comprise an oxide, a nitride, or some other dielectric material. (Mask layers 214 and 215 can, alternatively, be made of a material that is not a dielectric material. Any material may be used provided it is able to withstand trench etch and SiGe etch processes.) In a particular embodiment, electrically insulating layer 212 comprises an oxide, mask layer 214 also comprises an oxide, and mask layer 215 comprises a nitride. In one embodiment, mask layers 214 and 215 may be combined into a single mask layer comprising an oxide, a nitride, or the like.

Figure 3:
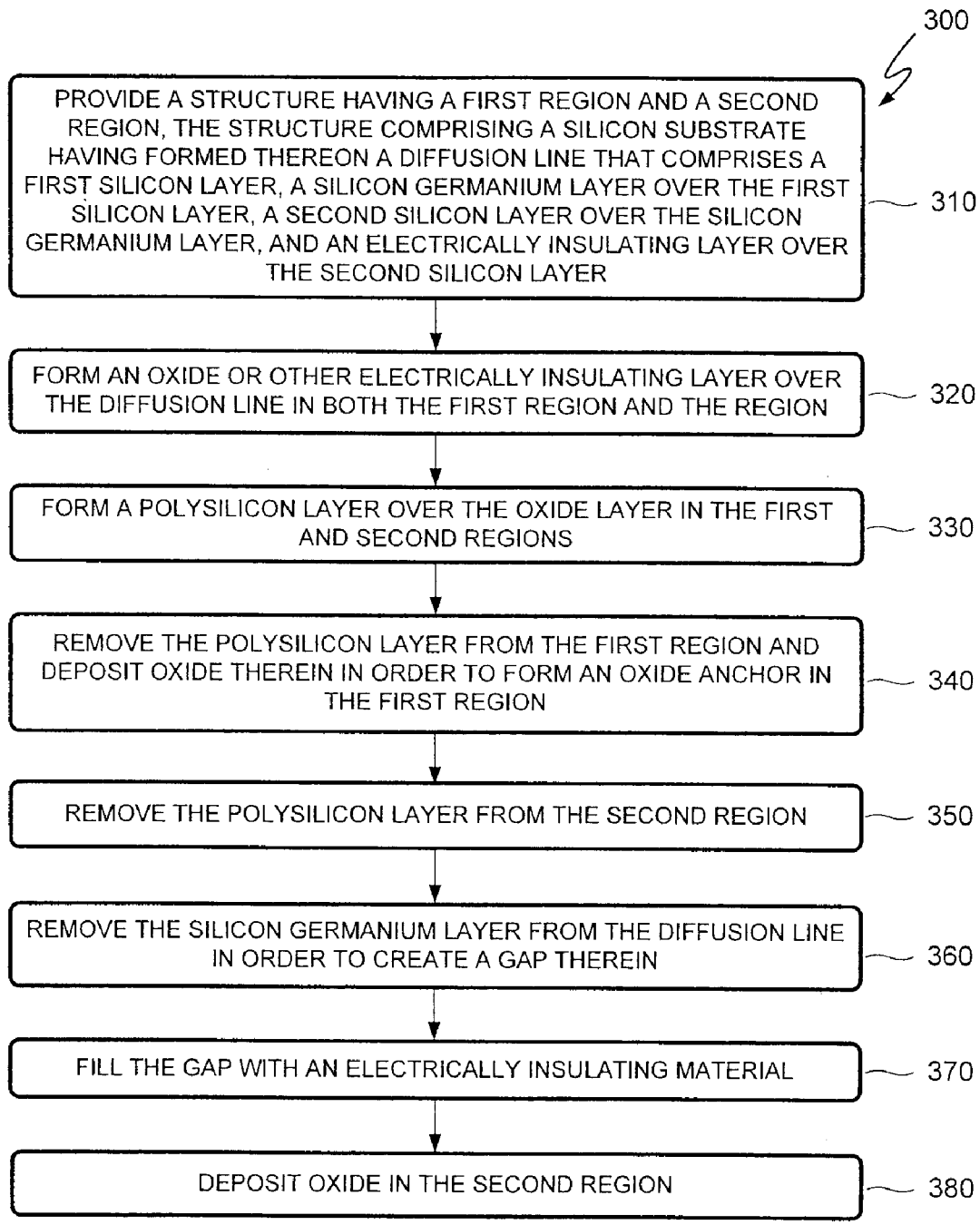
FIG. 3 is a flowchart illustrating a method of preparing active silicon regions for CMOS or other devices according to an embodiment of the invention.

FIG. 3 is a flowchart illustrating a method 300 of preparing active silicon regions for CMOS or other devices according to an embodiment of the invention. A step 310 of method 300 is to provide a structure having a first region and a second region, the structure comprising a silicon substrate having formed thereon a diffusion line that comprises a first silicon layer, a SiGe layer over the first silicon layer, a second silicon layer over the SiGe layer, and a mask layer over the second silicon layer. As an example, the structure can be similar to CMOS device 100, the first region can be similar to region A-A, and the second region can be similar to region B-B, all of which are shown in FIG. 2. As another example, the silicon substrate, the first silicon layer, the second silicon layer, and the mask layer can be similar to, respectively, silicon substrate 210, silicon layer 211, silicon layer 213, and one or both of mask layers 214 and 215, all of which are shown in FIG. 2. As another example, as set forth below, the silicon substrate, the first silicon layer, the second silicon layer, and the mask layer can be similar to corresponding features of a CMOS device 400, a portion of which is shown in FIG. 4, discussed below.

Figure 4:
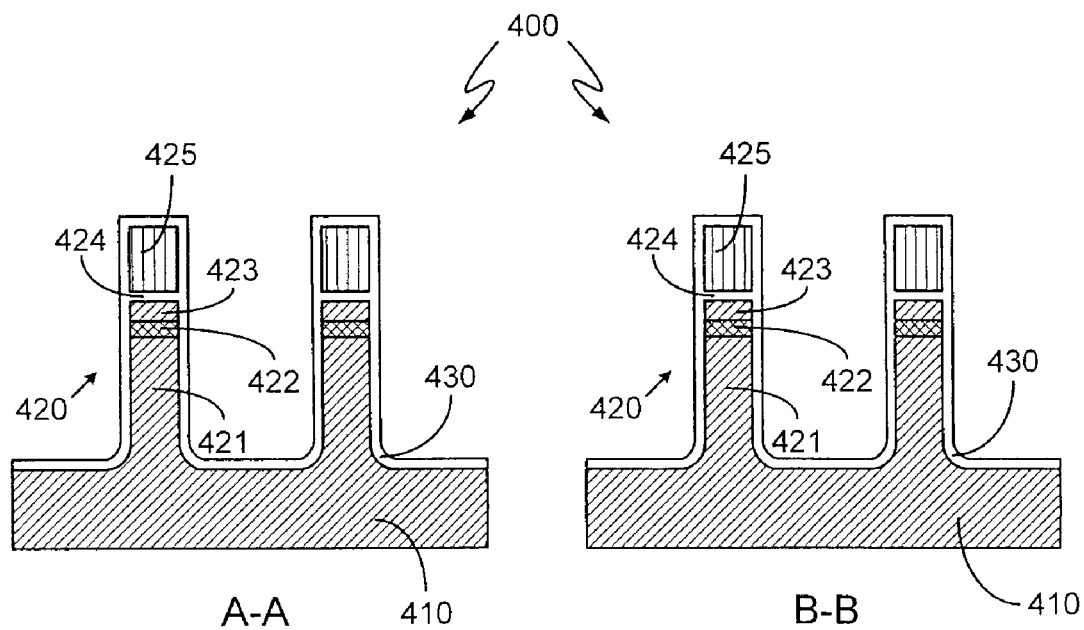
FIGS. 4-10 are cross-sectional views of a portion of a CMOS device at various particular points in its manufacturing process according to the embodiment of FIG. 3.

FIG. 4, as alluded to above, is a cross-sectional view of a portion of CMOS device 400 at a particular point in its manufacturing process according to an embodiment of the invention. FIG. 4, along with subsequent figures as called out in the following discussion, depict CMOS device 400 at various stages in its manufacturing process according to an embodiment of the invention. As illustrated, CMOS device 400 has a double gate structure (with a silicon layer 421 acting as a backside gate) but the methods disclosed herein are not limited to double gate structures.

As illustrated in FIG. 4, CMOS device 400 comprises a silicon substrate 410. Silicon substrate 410 has a diffusion line 420 formed thereon that comprises silicon layer 421, a SiGe layer 422 over silicon layer 421, a silicon layer 423 over SiGe layer 422, an oxide layer 424 over silicon layer 423, and a nitride layer 425 over oxide layer 424. As an example, the silicon substrate, the first silicon layer, the second silicon layer, and the mask layer that were mentioned above in connection with step 310 of method 300 can be similar to, respectively, silicon substrate 410, silicon layer 421, silicon layer 423, and oxide layer 424 and/or nitride layer 425, all of which are shown in FIG. 4. As another example, the SiGe layer that was mentioned in connection with step 310 of method 300 can be similar to SiGe layer 422 that is also shown in FIG. 4.

A step 320 of method 300 is to form an oxide or other electrically insulating layer over the diffusion line in both the first region and the second region. As an example, the oxide layer can be similar to an oxide cap 430 that is shown in FIG. 4. In at least some embodiments, including the illustrated embodiment, the CMOS device includes multiple diffusion lines separated by trenches and these trenches are partially filled with the same oxide that covers the diffusion lines. This oxide layer needs to be thick enough to protect the sidewalls of the silicon fins from subsequent wet cleans and poly dry/wet etches. In one embodiment, step 320 comprises growing the oxide layer in a thermal oxidation process. In another embodiment, step 320 comprises depositing the oxide layer using a chemical vapor deposition process.

Figure 5:
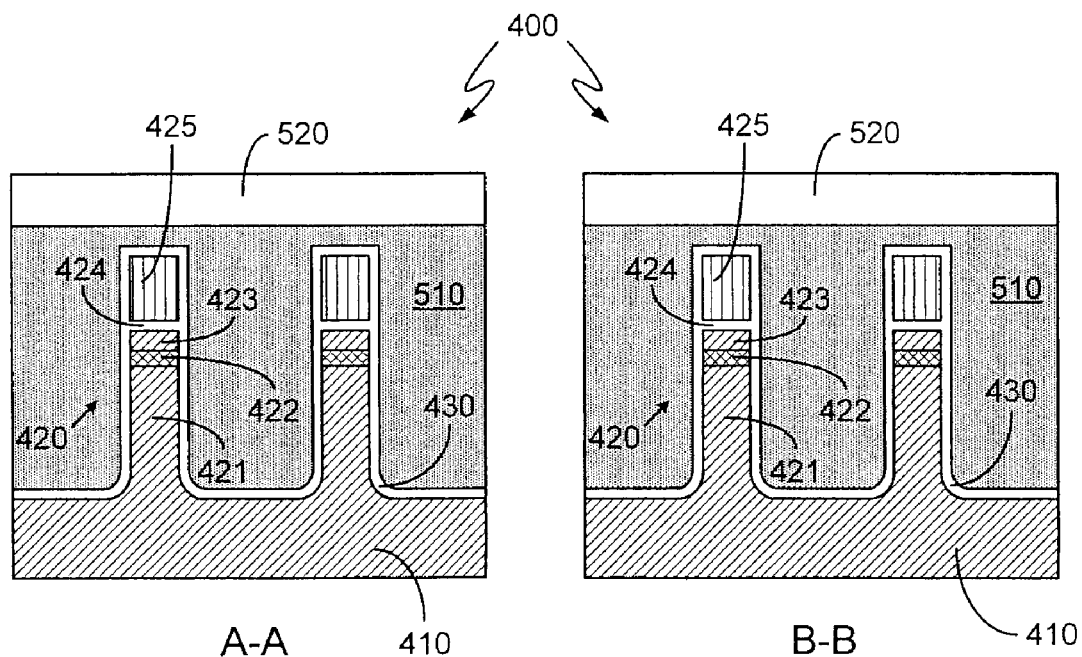

A step 330 of method 300 is to form a polysilicon layer over the oxide layer in the first and second regions. As shown in FIG. 5, which is a cross-sectional view of a portion of CMOS device 400 at a particular point in its manufacturing process according to an embodiment of the invention, this polysilicon layer covers the diffusion lines and fills the trenches between diffusion lines. As an example, the polysilicon layer can be similar to a polysilicon layer 510 that is shown in FIG. 5. A hard mask 520, used in some embodiments during polysilicon etching or other subsequent processing steps, is also depicted in FIG. 5. As an example, hard mask 520 may comprise nitride. The first region from which the polysilicon will be removed is defined by lithography on hard mask and hard mask removal.

Figure 6:
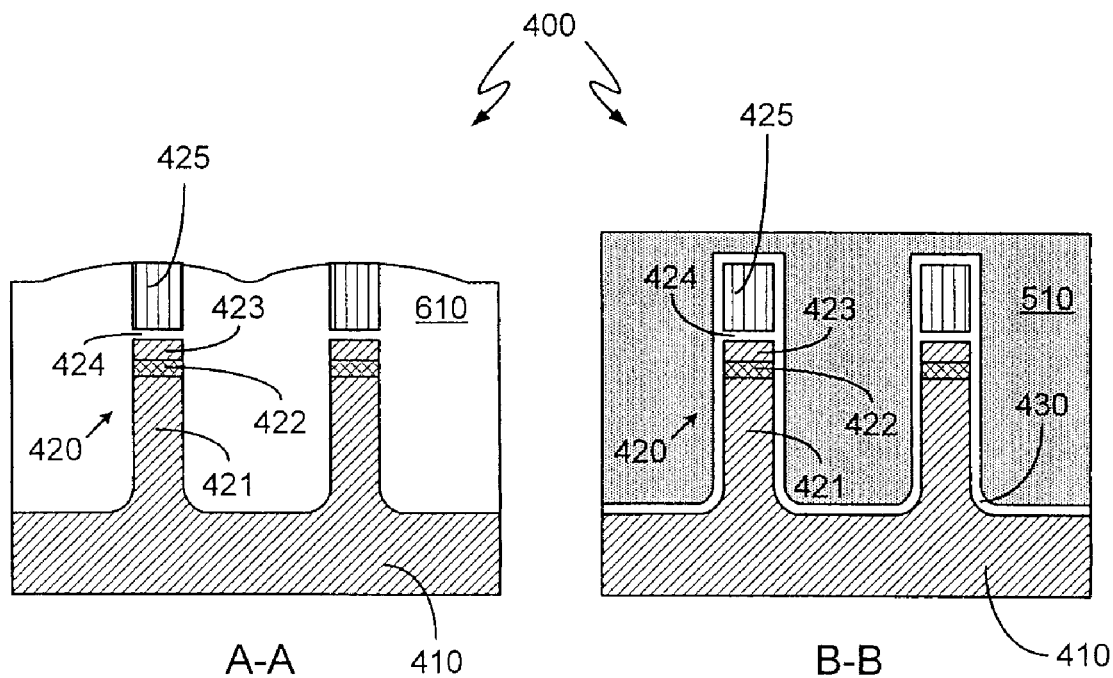

A step 340 of method 300 is to remove the polysilicon layer from the first region, e.g., using a dry etch or the like, and to deposit oxide therein in order to form an oxide anchor in the first region. The result is shown in FIG. 6, which, like FIGS. 4 and 5, is a cross-sectional view of a portion of CMOS device 400 at a particular point in its manufacturing process according to an embodiment of the invention. As illustrated in FIG. 6, CMOS device 400 comprises an oxide anchor 610 in region A-A that can be an example of the oxide anchor mentioned in connection with step 340 of method 300.

In one embodiment, the polysilicon layer is planarized using a chemical mechanical polish (CMP) or similar operation prior to its removal. While not required, such planarization helps to provide a more flat topography that is beneficial for subsequent polysilicon patterning.

FIG. 6 also illustrates that following step 340 region B-B still contains polysilicon layer 510. Note that in region A-A oxide anchor 610 has been etched back (using either a dry or a wet etch) or polished (e.g., using CMP) such that an upper surface thereof is approximately at the same level as an upper surface of nitride layer 425. This same etch or polish step opens (exposes) polysilicon layer 510 in region B-B. (Prior to the etch or polish operation an oxide layer resulting from the step 340 oxide deposition was located over polysilicon layer 510.) Hard mask 520 was removed, in both regions A-A and B-B, in a separate step or sub-step.

A step 350 of method 300 is to remove the polysilicon layer from the second region. This finishes the oxide anchor structure. Notably, and advantageously, top silicon (the future location of active silicon devices) and sidewalls have to this point not been exposed to plasma. The selectivity of polysilicon etching against oxide or nitride is very high, so negligible loss of the oxide anchor is expected during polysilicon removal and oxide cap etch.

Figure 7:
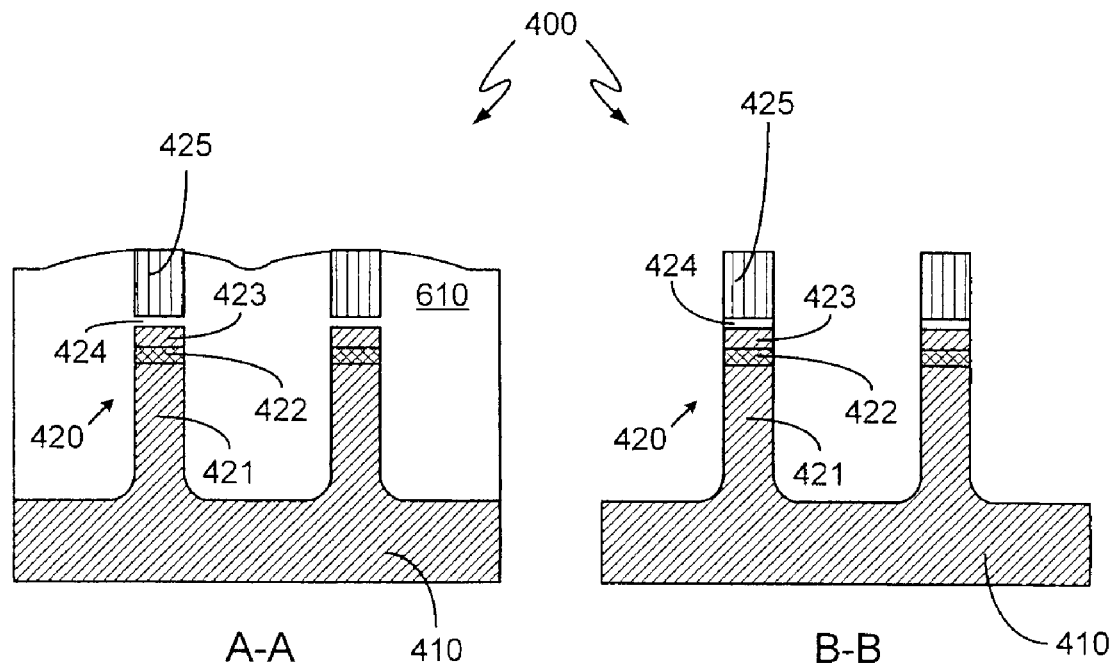

As an example, step 350 may be performed using a selective wet etch. The result is shown in FIG. 7, which, like FIGS. 4-6, is a cross-sectional view of a portion of CMOS device 400 at a particular point in its manufacturing process according to an embodiment of the invention. Oxide cap 430 has also been removed from region B-B at the point in the manufacturing process that is depicted in FIG. 7. This is done in order to expose the sidewall of the diffusion line. As an example, oxide cap 430 can be removed using hydrofluoric acid (HF) or the like.

A step 360 of method 300 is to remove the silicon germanium layer from the diffusion line in order to create a gap therein. As an example, the gap, sometimes called a backside gap, can be similar to a gap 810 that is first shown in FIG. 8, which, like FIGS. 4-7, is a cross-sectional view of a portion of CMOS device 400 at a particular point in its manufacturing process according to an embodiment of the invention. Oxide anchor 610 becomes important during this step for holding top silicon in place after the SiGe layer is removed. Without the anchor structure, top silicon would fall down or be otherwise damaged. As known in the art, the chemistry used to remove the SiGe does not etch oxide. Instead, the chemistry goes through the oxide to reach the SiGe layer.

It should be understood that the oxide anchor supports top silicon in both region A-A and in region B-B since top silicon is one piece (extending through both regions). Mechanical strength allows the oxide anchor to hold top silicon in both regions while being itself confined to region A-A.

Figure 8:
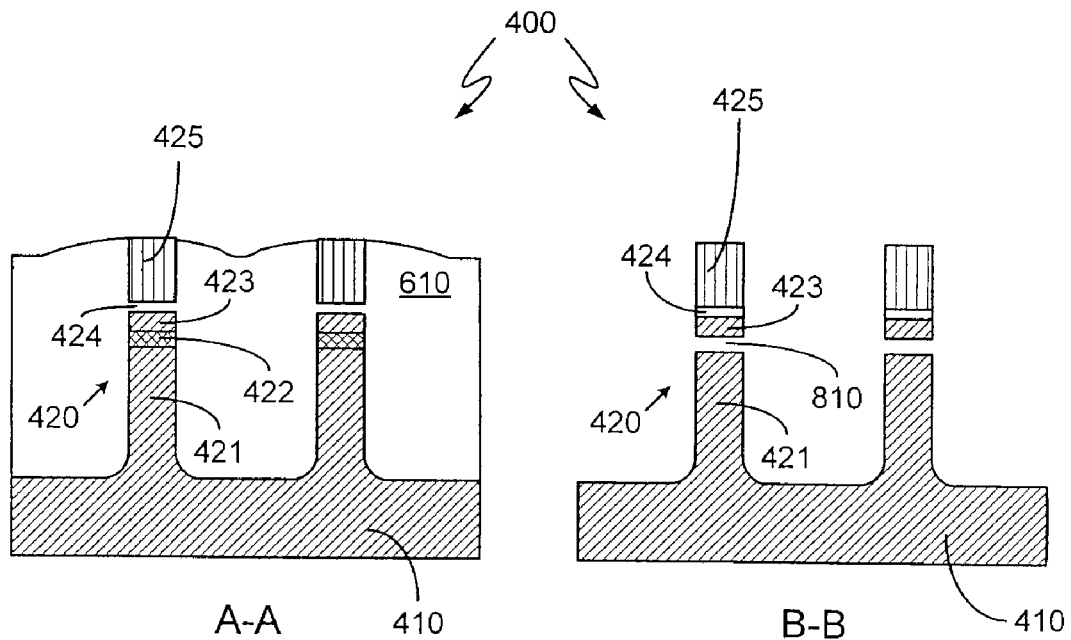
Figure 9:
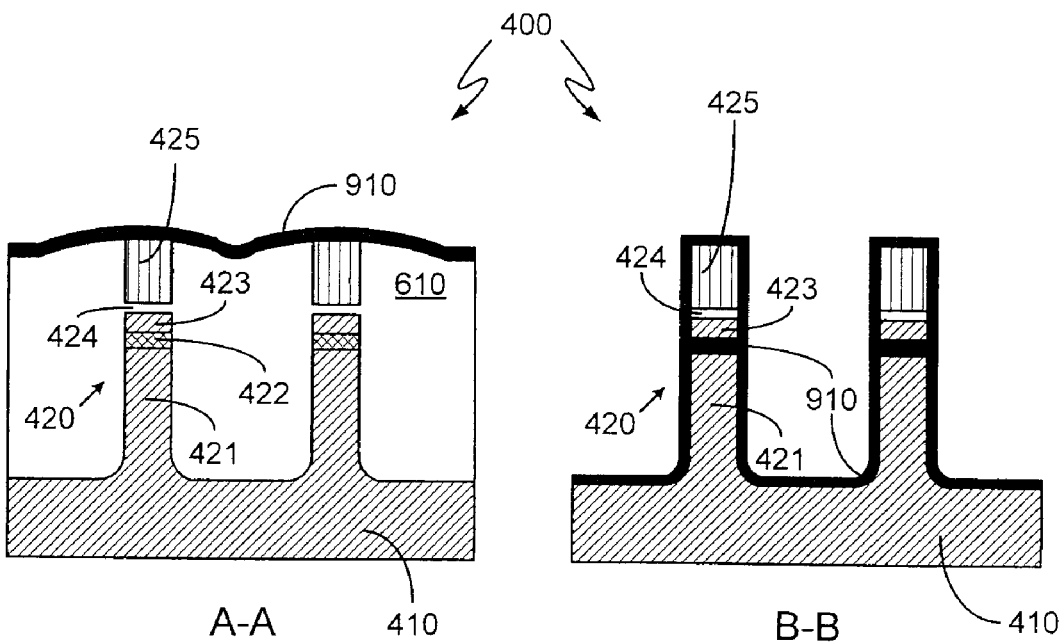

A step 370 of method 300 is to fill the gap with an electrically insulating material. As an example, the electrically insulating material can be similar to an electrically insulating material 910 that is first shown in FIG. 9, which, like FIGS. 4-8, is a cross-sectional view of a portion of CMOS device 400 at a particular point in its manufacturing process according to an embodiment of the invention. Oxide growth, dielectric deposition, or a combination of these processes may be used in order to fill the backside gap. As illustrated in FIG. 9, electrically insulating material 910 forms a layer above oxide anchor 610 in region A-A and forms a conformal layer around diffusion line 420 in region B-B.

As an example, electrically insulating material 910 can comprise an oxide (including the same oxide as that used for oxide anchor 610). As another example, electrically insulating material 910 can comprise a silicon nitride or a high-k dielectric material (i.e., a material having a dielectric constant significantly greater that that of silicon dioxide or in other words for example, having a dielectric constant of approximately 10 or greater). In general, the makeup of electrically insulating material 910 depends on its fill capability and on what properties it must have according to design parameters.

Figure 10:
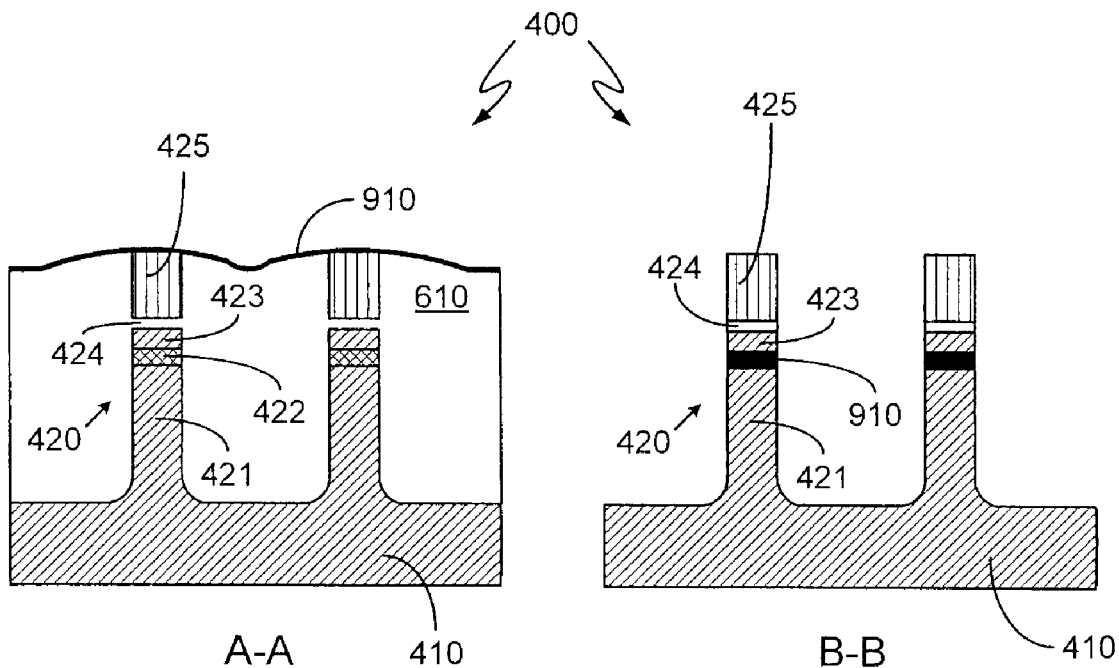

In one embodiment, excess portions of electrically insulating material 910 are subsequently removed, as shown in FIG. 10, which, like FIGS. 4-9, is a cross-sectional view of a portion of CMOS device 400 at a particular point in its manufacturing process according to an embodiment of the invention. As illustrated in FIG. 10, the removal of excess portions of electrically insulating material 910 results in a thinner layer of electrically insulating material 910 remaining above oxide anchor 610 in region A-A. In region B-B the result is that electrically insulating material 910 remains only in gap 810 (see FIG. 8 for a depiction of gap 810). It should be understood that any portion of electrically insulating material 910 apart from that portion occupying the space formerly occupied by SiGe may be considered an "excess portion" of electrically insulating material 910.

Of course, in embodiments where electrically insulating material 910 is the same material as that used for oxide anchor 610 (i.e., also an oxide) then electrically insulating material 910 and oxide anchor 610 are indistinguishable from each other and appear as a single layer. In some such embodiments, furthermore, no portion of electrically insulating material 910 need be removed. In general, excess insulator layer portions need not be removed if the electrically insulating material is compatible with subsequent processes.

A step 380 of method 300 is to deposit oxide in the second region. The result of step 380 is a structure identical or very similar to CMOS device 100 that is shown in FIG. 1. It should be understood that an etching or polishing operation may need to be performed following step 380 before CMOS device 400 has the smooth oxide surface in regions A-A and B-B that is shown in FIG. 1 for CMOS device 100. From this point on, standard CMOS processing can be followed to finish CMOS device 100 since the trench structure and topology are the same as those used in current standard CMOS process flows. For example, in this oxide anchor scheme, since polysilicon is a sacrificial layer to be removed before SiGe etching, there will be no impact on downstream processes.

Figure 11:
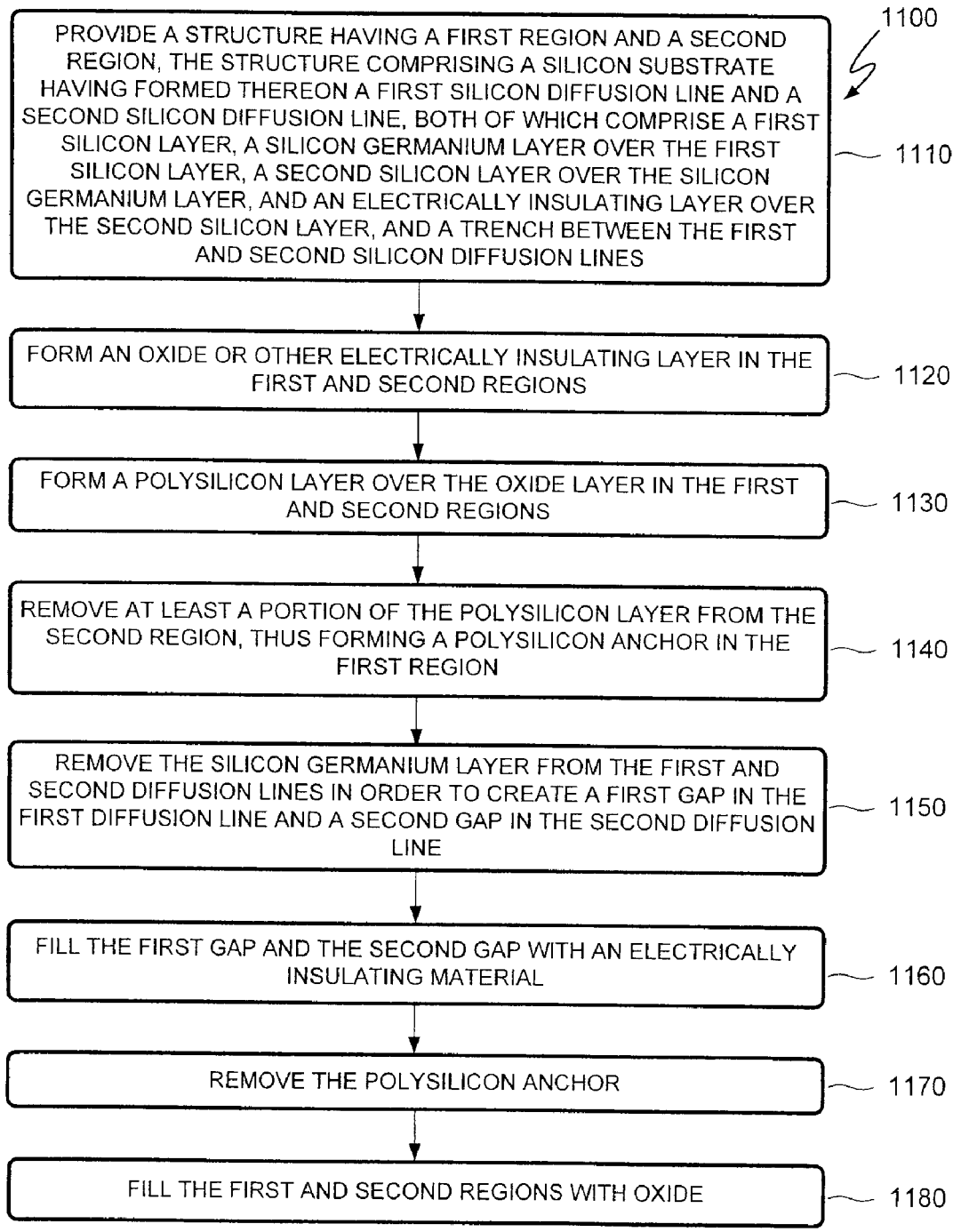
FIG. 11 is a flowchart illustrating a method of preparing active silicon regions for CMOS or other devices according to another embodiment of the invention.

FIG. 11 is a flowchart illustrating a method 1100 of preparing active silicon regions for CMOS or other devices according to another embodiment of the invention. A step 1110 of method 1100 is to provide a structure having a first region and a second region, the structure comprising a silicon substrate having formed thereon a first silicon diffusion line and a second silicon diffusion line, both of which comprise a first silicon layer, a silicon germanium layer over the first silicon layer, a second silicon layer over the silicon germanium layer, and a mask layer over the second silicon layer, and a trench between the first and second silicon diffusion lines.

As an example, the structure can be similar to CMOS device 100, the first region can be similar to region A-A, and the second region can be similar to region B-B, all of which are shown in FIG. 2. As another example, the silicon substrate, the first silicon layer, the second silicon layer, and the mask layer can be similar to, respectively, silicon substrate 210, silicon layer 211, silicon layer 213, and one or both of mask layers 214 and 215, all of which are shown in FIG. 2. As another example, the silicon substrate, the first silicon layer, the second silicon layer, and the mask layer can be similar to silicon substrate 410, silicon layer 421, silicon layer 423, and oxide layer 424 and/or nitride layer 425, all of which are part of CMOS device 400 as shown in FIG. 4. As another example, the SiGe layer that was mentioned in connection with step 1110 of method 1100 can be similar to SiGe layer 422 that is also shown in FIG. 4.

A step 1120 of method 1100 is to form an oxide or other layer in the first and second regions. As an example, the oxide layer can be similar to oxide cap 430 that is shown in FIG. 4. In at least some embodiments, including the illustrated embodiment, the CMOS device includes multiple diffusion lines separated by trenches and these trenches are partially filled with the same oxide that covers the diffusion lines. This oxide layer needs to be thick enough to protect the sidewalls of the diffusion lines from subsequent wet cleans and poly dry/wet etches. In one embodiment, step 1120 comprises growing the oxide layer in a thermal oxidation process. In another embodiment, step 1120 comprises depositing the oxide layer using a chemical vapor deposition process.

A step 1130 of method 1100 is to form a polysilicon layer over the oxide layer in the first and second regions. As an example, the polysilicon layer can be similar to polysilicon layer 510 that is shown in FIG. 5. The polysilicon layer, in at least one embodiment, will be patterned and dry etched in order to directly define an anchor structure, as will now be discussed in further detail.

Figure 12:
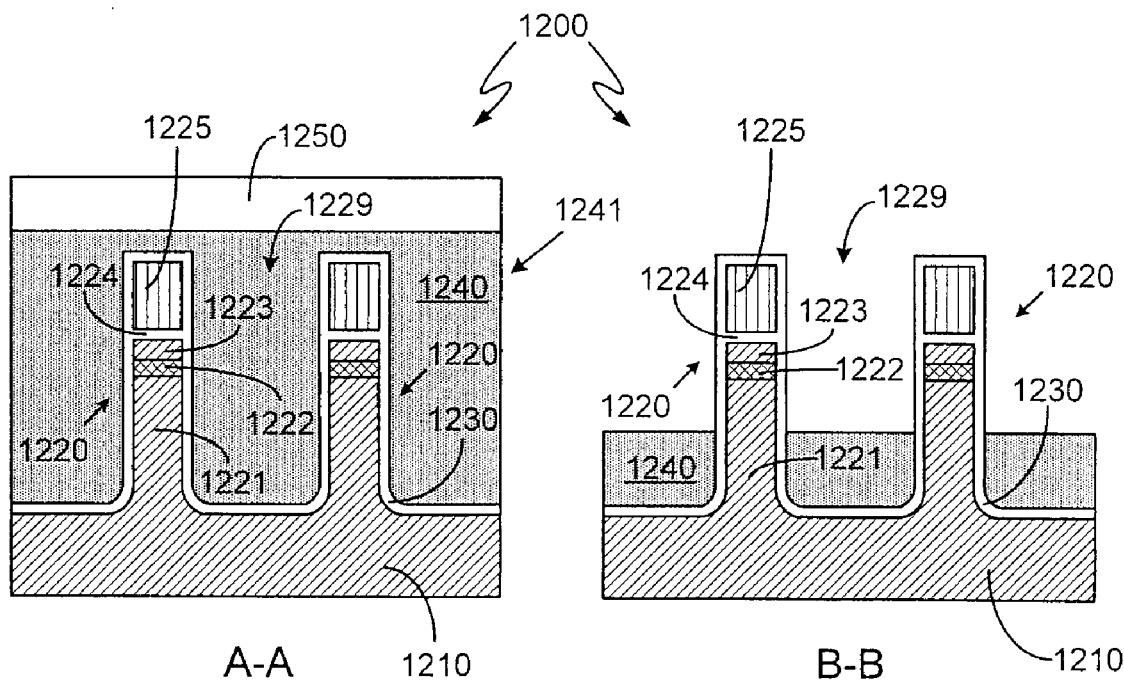
FIGS. 12-15 are cross-sectional views of a portion of a CMOS device at various particular points in its manufacturing process according to the embodiment of FIG. 11.

A step 1140 of method 1100 is to remove at least a portion of the polysilicon layer from the second region, thus forming a polysilicon anchor in the first region. The result is shown in FIG. 12, which is a cross-sectional view of a portion of a CMOS device 1200 at a particular point in its manufacturing process according to an embodiment of the invention. FIG. 12, along with subsequent figures as called out in the following discussion, depict CMOS device 1200 at various stages in its manufacturing process according to an embodiment of the invention. As illustrated, CMOS device 1200 has a double gate structure (with a silicon layer 1221 acting as a backside gate) but, as mentioned previously, the methods disclosed herein are not limited to double gate structures. In one embodiment, step 1140 comprises etching away the portion of the polysilicon layer using a dry etch. The selectivity of SiGe etching over polysilicon and oxide is shown to be high, so the polysilicon anchor will sustain negligible damage during SiGe etching.

Steps 1110, 1120, and 1130 of method 1100 resulted in structures that were identical or very similar to corresponding structures at corresponding stages of method 300, described above. The discussion of steps 1110, 1120, and 1130 thus referred to figures that were first introduced during the discussion of method 300. Beginning at step 1140, method 1100 diverges from method 300 in certain respects and for this reason step 1140 and subsequent steps of method 1100 will no longer refer back to earlier figures, referring instead to FIG. 12 and other figures dedicated to method 1100.

As illustrated in FIG. 12, CMOS device 1200 comprises a silicon substrate 1210. Silicon substrate 1210 has diffusion lines 1220 formed thereon that each comprise silicon layer 1221, a SiGe layer 1222 over silicon layer 1221, a silicon layer 1223 over SiGe layer 1222, an oxide layer 1224 over silicon layer 1223, and a nitride layer 1225 over oxide layer 1224. It should be understood that although the illustrated embodiment shows two diffusion lines, CMOS device is not limited to two diffusion lines, and in some embodiments will have many more than two diffusion lines. Diffusion lines 1220 are separated by a trench 1229. (Similar trenches lie between each adjacent pair of diffusion lines in CMOS device 1200.)

As an example, silicon substrate 1210, diffusion lines 1220, silicon layer 1221, SiGe layer 1222, silicon layer 1223, oxide layer 1224, and nitride layer 1225 can be similar to, respectively, silicon substrate 410, diffusion line 420, silicon layer 421, SiGe layer 422, silicon layer 423, oxide layer 424, and nitride layer 425, all of which are shown in FIG. 4. CMOS device 1200 further comprises an oxide cap 1230 over diffusion lines 1220. As an example, oxide cap 1230 can be similar to oxide cap 430 that is also shown in FIG. 4.

CMOS device 1200 also comprises a polysilicon layer 1240 in both region A-A and region B-B. The removal of a portion of polysilicon layer 1240 from region B-B that takes place in step 1140 of method 1100 results in the formation of a polysilicon anchor 1241 in region A-A that is an example of the polysilicon anchor mentioned above in connection with step 1140. A hard mask 1250 protects polysilicon anchor 1241 during the dry etch (or similar operation) that removes portions of polysilicon layer 1240 from region B-B. As an example, hard mask 1250 can be similar to hard mask 520 that is shown in FIG. 5.

Figure 13:
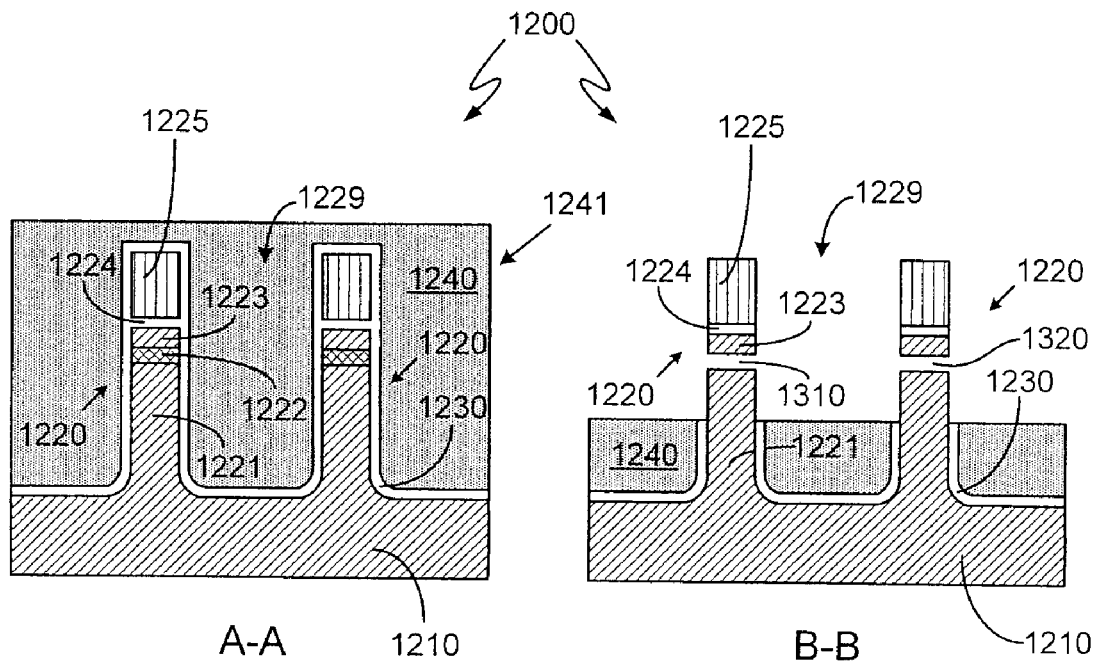

A step 1150 of method 1100 is to remove the silicon germanium layer from the first and second diffusion lines in order to create a first gap in the first diffusion line and a second gap in the second diffusion line. As an example, the first gap can be similar to a gap 1310 and the second gap can be similar to a gap 1320, both of which are shown in FIG. 13, which, like FIG. 12, is a cross-sectional view of a portion of CMOS device 1200 at a particular point in its manufacturing process according to an embodiment of the invention. Gap 1310 and gap 1320 can both be similar to gap 810 that is shown in FIG. 8. The SiGe etch needs to be selective to polysilicon so that the polysilicon anchor holds top silicon during SiGe etch.

It should be understood that the polysilicon anchor supports top silicon in both region A-A and in region B-B since top silicon is one piece (extending through both regions). Mechanical strength allows the polysilicon anchor to hold top silicon in both regions while being itself confined to region A-A.

Figure 14:
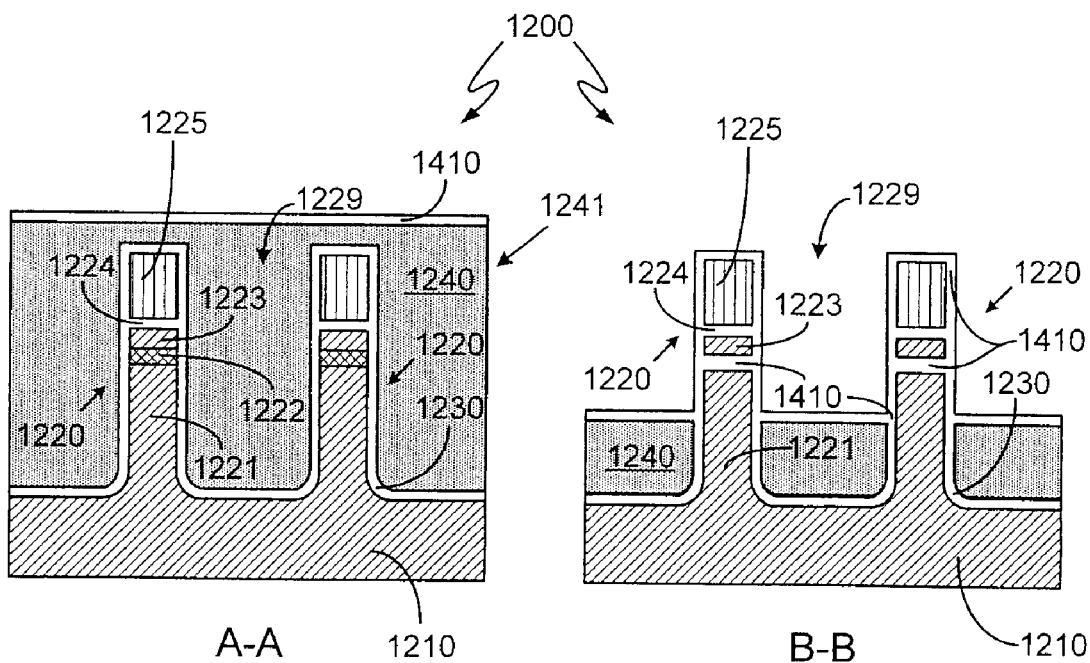

A step 1160 of method 1100 is to fill the first gap and the second gap with an electrically insulating material. As an example, the electrically insulating material can be similar to an electrically insulating material 1410 that is shown in FIG. 14, which, like FIGS. 12 and 13, is a cross-sectional view of a portion of CMOS device 1200 at a particular point in its manufacturing process according to an embodiment of the invention. As an example, electrically insulating material 1410 can be similar to electrically insulating material 910 that is first shown in FIG. 9.

Figure 15:
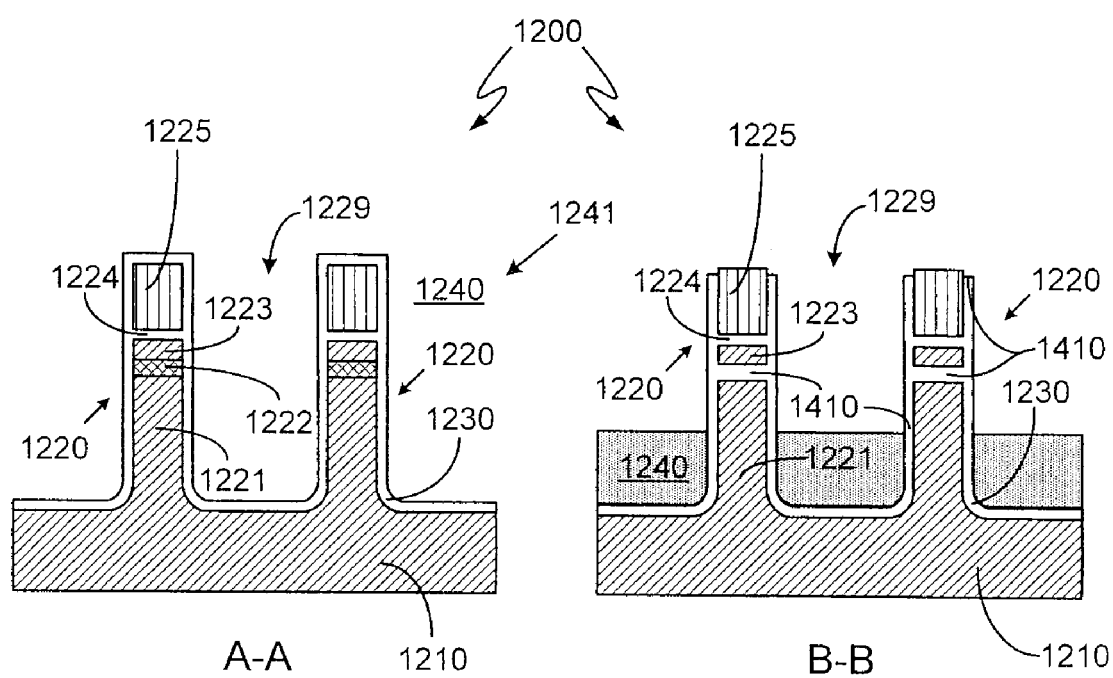

A step 1170 of method 1100 is to remove the polysilicon anchor. The result is shown in FIG. 15, which, like FIGS. 12-14, is a cross-sectional view of a portion of CMOS device 1200 at a particular point in its manufacturing process according to an embodiment of the invention. In one embodiment, step 1170 comprises etching away the polysilicon anchor using a wet etch. It should be understood that the top surface of polysilicon layer 1240 must be opened (exposed) by dry etching or the like prior to the performance of step 1170.

A step 1180 of method 1100 is to fill the first and second regions with oxide. The result of step 1180 is a structure identical or very similar to CMOS device 100 that is shown in FIG. 1. It should be understood that an etching or polishing operation may need to be performed following step 1180 before CMOS device 1200 has the smooth oxide surface in regions A-A and B-B that is shown in FIG. 1 for CMOS device 100. From this point on, standard CMOS processing can be followed to finish CMOS device 100 since the trench structure and topology are the same as those used in current standard CMOS process flows.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the methods for preparing active silicon regions discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of preparing active silicon regions for CMOS or other devices, the method comprising:
   providing a structure having a first region and a second region, the structure comprising a silicon substrate having formed thereon a diffusion line that comprises:
   a first silicon layer;
   a silicon germanium layer over the first silicon layer;
   a second silicon layer over the silicon germanium layer; and
   a mask layer over the second silicon layer;
   forming an oxide layer in the first and second regions;
   forming a polysilicon layer over the oxide layer in the first and second regions;
   removing the polysilicon layer from the first region and depositing oxide therein in order to form an oxide anchor in the first region;
   removing the polysilicon layer from the second region;
   removing the silicon germanium layer from the diffusion line in order to create a gap therein;
   filling the gap with an electrically insulating material; and
   depositing oxide in the second region.

2. The method of claim 1 wherein:
   forming the oxide layer comprises growing the oxide layer in a thermal oxidation process.

3. The method of claim 1 wherein:
   forming the oxide layer comprises depositing the oxide layer using a chemical vapor deposition process.

4. The method of claim 1 further comprising:
   planarizing the polysilicon layer prior to removing it from the first region.

5. The method of claim 4 wherein:
   planarizing the polysilicon layer comprises performing a chemical mechanical polishing operation on the polysilicon layer.

6. The method of claim 1 further comprising:
   removing an excess portion of the electrically insulating material prior to depositing oxide in the second region.

7. The method of claim 1 wherein:
   the electrically insulating material comprises an oxide.

8. The method of claim 1 wherein:
   the electrically insulating material comprises a material having a dielectric constant of approximately 10 or greater.

9. A method of preparing active silicon regions for CMOS or other devices, the method comprising:
   providing a structure having a first region and a second region, the structure comprising:
   a silicon substrate having formed thereon a first silicon diffusion line and a second silicon diffusion line, both of which comprise:
   a first silicon layer;
   a silicon germanium layer over the first silicon layer;
   a second silicon layer over the silicon germanium layer; and
   a mask layer over the second silicon layer; and
   a trench between the first and second silicon diffusion lines;
   forming an oxide layer in the first and second regions;
   forming a polysilicon layer over the oxide layer in the first and second regions;

removing at least a portion of the polysilicon layer from the second region, thus forming a polysilicon anchor in the first region;

removing the silicon germanium layer from the first and second diffusion lines in order to create a first gap in the first diffusion line and a second gap in the second diffusion line;

filling the first gap and the second gap with an electrically insulating material;

removing the polysilicon anchor; and filling the first and second regions with oxide.

10. The method of claim 9 wherein:

removing at least the portion of the polysilicon layer comprises etching away the portion of the polysilicon layer using a dry etch.

11. The method of claim 9 wherein:

removing the polysilicon anchor comprises etching away the polysilicon anchor using a wet etch.

12. The method of claim 9 wherein:

the electrically insulating material comprises an oxide.

13. The method of claim 9 wherein:

the electrically insulating material comprises a material having a dielectric constant of approximately 10 or greater.

14. The method of claim 9 wherein:

forming the oxide layer comprises growing the oxide layer in a thermal oxidation process.

15. The method of claim 9 wherein:

forming the oxide layer comprises depositing the oxide layer using a chemical vapor deposition process.

\* \* \* \* \*